(12) United States Patent
Han et al.

(10) Patent No.: US 11,780,217 B2
(45) Date of Patent: Oct. 10, 2023

(54) DUMMY REMOVAL DEVICE AND METHOD OF DRIVING THE SAME

(71) Applicant: Samsung Display Co., Ltd., Yongin-si (KR)

(72) Inventors: Seoin Han, Cheonan-si (KR); Minji Kim, Seoul (KR); Taehyun Jung, Seoul (KR); Ho Yun Kang, Busan (KR); Sungwoo Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/561,092

(22) Filed: Dec. 23, 2021

(65) Prior Publication Data

US 2022/0242104 A1 Aug. 4, 2022

(30) Foreign Application Priority Data

Feb. 4, 2021 (KR) ........................ 10-2021-0016145

(51) Int. Cl.
*B32B 43/00* (2006.01)
*H05K 13/04* (2006.01)
*B32B 38/18* (2006.01)
*G06F 1/16* (2006.01)

(52) U.S. Cl.
CPC ............ *B32B 43/006* (2013.01); *B32B 38/18* (2013.01); *H05K 13/0408* (2013.01); *B32B 43/003* (2013.01); *B32B 2457/20* (2013.01); *G06F 1/1652* (2013.01); *Y10T 156/1132* (2015.01); *Y10T 156/1944* (2015.01)

(58) Field of Classification Search
CPC ............ B32B 43/006; Y10T 156/1132; Y10T 156/1179; Y10T 156/1184; Y10T 156/1944
See application file for complete search history.

(56) References Cited

U.S. PATENT DOCUMENTS

| | | | | |
|---|---|---|---|---|
| 7,595,857 B2* | 9/2009 | Yang | ..................... | G02F 1/1339 349/154 |
| 8,991,463 B2* | 3/2015 | Jeong | .................. | B29C 63/0013 156/763 |
| 10,406,799 B1* | 9/2019 | Zhou | ................... | B29C 63/0056 |
| 11,161,335 B2* | 11/2021 | Jung | .................... | B32B 43/003 |
| 2015/0283799 A1* | 10/2015 | Posarelli | ................ | B32B 38/10 156/750 |

FOREIGN PATENT DOCUMENTS

| KR | 10-2014-0049305 | 4/2014 |
|---|---|---|
| KR | 10-1674539 | 11/2016 |
| KR | 10-1843695 | 3/2018 |
| KR | 10-2191517 | 12/2020 |

* cited by examiner

*Primary Examiner* — Philip C Tucker
*Assistant Examiner* — Nickolas R Harm
(74) *Attorney, Agent, or Firm* — KILE PARK REED & HOUTTEMAN PLLC

(57) ABSTRACT

A dummy removal device includes a picker picking a point of a dummy portion of a preliminary display module and moving in a first moving direction to separate a first portion of the dummy portion from the preliminary display module; and a separator disposed adjacent to the separated first portion and moving in a second moving direction intersecting the first moving direction to remove a second portion of the dummy portion from the preliminary display module, and the dummy portion is disposed around an effective portion of the preliminary display module.

21 Claims, 19 Drawing Sheets

DUMMY REMOVAL DEVICE AND METHOD OF DRIVING THE SAME

CROSS-REFERENCE TO RELATED APPLICATION(S)

This application claims priority to and benefits of Korean Patent Application No. 10-2021-0016145 under 35 U.S.C. § 119, filed on Feb. 4, 2021 in the Korean Intellectual Property Office, the entire contents of which are incorporated herein by reference.

BACKGROUND

1. Technical Field

The disclosure relates to a dummy removal device and a method of driving the same. The disclosure relates to a dummy removal device that removes a dummy portion from an effective portion therearound and a method of driving the dummy removal device.

2. Description of the Related Art

In general, a display device may include a display module that may include a display element layer like an organic light emitting diode and a circuit element layer used to drive the display element layer. To improve a manufacturing efficiency of the display device, the circuit element layer and the display element layer may be commonly formed over a substrate including cell areas, the substrate may be cut through a cutting process in the unit of each cell, and thus, preliminary display modules may be formed. Each preliminary display module is shape-processed to meet needs, so that a display module with a desired shape may be completed.

Accordingly, when manufacturing the display module, an equipment is required to separate an effective portion of the preliminary display module corresponding to the display module from a dummy portion corresponding to a periphery of the effective portion.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a dummy removal device capable of improving productivity.

The disclosure provides a method of driving the dummy removal device.

Embodiments provide a dummy removal device that may include a picker picking a point of a dummy portion of a preliminary display module and moving in a first moving direction to separate a first portion of the dummy portion from the preliminary display module; and a separator disposed adjacent to the separated first portion and moving in a second moving direction intersecting the first moving direction to remove a second portion of the dummy portion from the preliminary display module, the dummy portion may be disposed around an effective portion of the dummy display module.

The point may be disposed at a side of the preliminary display module.

The point may include a first point and a second point spaced apart from the first point in a third moving direction intersecting the first moving direction and the second moving direction.

The dummy removal device may further include a body. The picker may include a first moving tool connected to the body and moving in the first moving direction; a first picker adsorption portion connected to the first moving tool and picking the first point; and a second picker adsorption portion connected to the first moving tool and picking the second point.

The first moving direction may be substantially perpendicular to the second moving direction, and the third moving direction may be substantially perpendicular to the first moving direction and the second moving direction.

The dummy removal device may further include a body. The separator may include a second moving tool connected to the body and moving in the second moving direction; and a lift portion connected to the second moving tool, disposed adjacent to the separated first portion, and moving in the second moving direction.

The picker may pick an upper surface of the first portion to separate the first portion from the preliminary display module, and the lift portion may be disposed adjacent to a lower surface of the separated first portion to remove the second portion from the preliminary display module.

The lift portion may have a shape substantially extending in the third moving direction intersecting the first moving direction and the second moving direction.

The lift portion may have a substantially cylindrical shape.

The lift portion may include block portions disposed at opposite ends of the lift portion, extending in the first moving direction, wherein the block portions guide a position of the dummy portion.

The picker may pick the upper surface of the first portion to separate the first portion from the preliminary display module, and the lift portion may include a grip portion disposed adjacent to a side surface and the lower surface of the separated first portion.

The dummy removal device may further include an error detector transmits an error occurrence signal to the dummy removal device when that the picker and the separator is abnormally operated.

The error detector may stop an operation of the dummy removal device in case that a magnitude of a force by the picker that is applied to the point to pick the point, is less than a magnitude.

The error detector may stop the operation of the dummy removal device in case that a travel distance in which the separator moves in the second moving direction is less than a distance.

Embodiments provide a method of driving a dummy removal device that may include picking a point of the dummy portion using a picker; moving the picker in a first moving direction to separate a first portion of the dummy portion from the preliminary display module; and moving a separator disposed adjacent to the separated first portion in a second moving direction intersecting the first moving direction to remove a second portion of the dummy portion from the preliminary display module, the dummy portion may be disposed around an effective portion of the dummy display module.

The method may further include placing the removed dummy portion on a storage portion. The dummy removal device may further include a body connected to the picker and the separator, and the picker places the removed dummy portion after the body moves in the second moving direction.

The method may further include determining whether the picker and the separator do not transmit an error occurrence signal to the dummy removal device.

The determining of whether the picker and the separator do not transmit an error occurrence signal to the dummy removal device may include comparing a magnitude of a force applied to the point to pick the point by the picker with a magnitude.

The determining of whether the picker and the separator do not transmit an error occurrence signal to the dummy removal device may include comparing a travel distance in which the separator moves in the second moving direction with a distance.

The separating of the first portion of the dummy portion from the preliminary display module may include moving the picker in a direction opposite to the first moving direction to pick the point and moving the picker in the first moving direction to separate the separated first portion from the preliminary display module, and the point may be disposed at a side of the preliminary display module.

According to the above, in the preliminary display module including the effective portion and the dummy portion, the space in the dummy portion required for the process to remove the dummy portion may be minimized. For example, the dummy removal device is able to remove the dummy portion by picking only the dummy portion disposed at the a side of the preliminary display module, and thus, the preliminary display module may not require the dummy portion to pick at another side thereof. Accordingly, the size of the preliminary display module including the effective portion may be reduced, the number of the preliminary display modules obtained in one substrate increases, and thus, the productivity may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
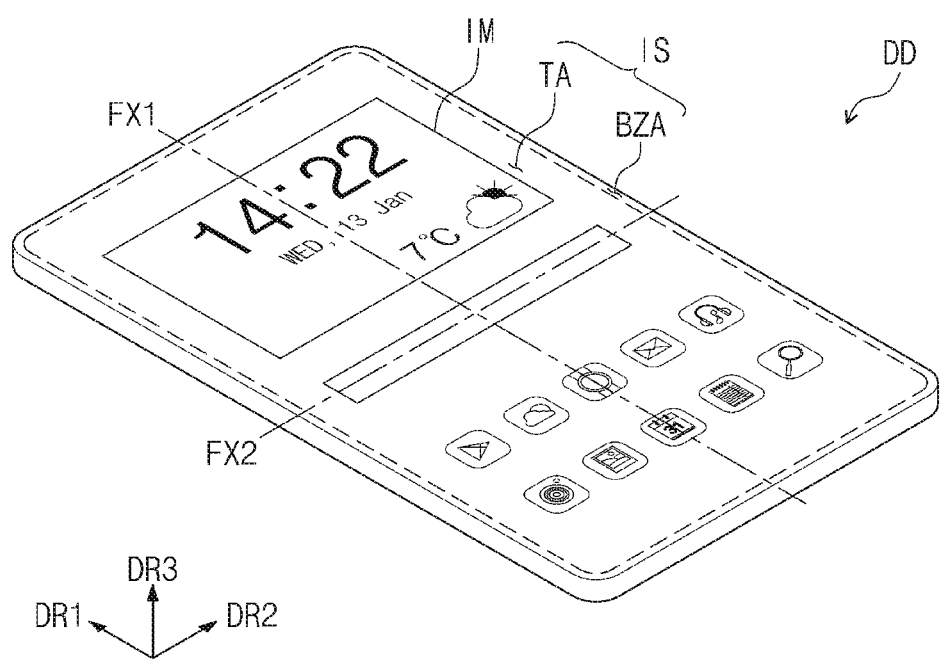
FIG. 1 is a schematic perspective view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element or layer is referred to as being "on", "connected to" or "coupled to" another element or layer, it can be directly on, connected or coupled to the other element or layer or intervening elements or layers may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Like numerals refer to like elements throughout. In the drawings, the thickness, ratio, and dimension of components are exaggerated for effective description of the technical content.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. However, the disclosure is not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, and/or components, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

FIG. 1 is a schematic perspective view showing a display device DD according to an embodiment.

Referring to FIG. 1, the display device DD may have a substantially rectangular shape with long sides in a first direction DR1 and short sides in a second direction DR2 crossing or intersecting the first direction DR1. However, the shape of the display device DD should not be limited to the substantially rectangular shape, and the display device DD may have a variety of shapes.

The display device DD may be a foldable display device. In detail, the display device DD according to an embodiment may be folded with respect to folding axes FX1 and FX2 extending in directions. Hereinafter, a state in which the display device DD is folded with respect to the folding axes FX1 and FX2 is referred to as a folded state, and a state in which the display device DD is not folded is referred to as an unfolded state.

The folding axes FX1 and FX2 may extend in the first direction DR1 or the second direction DR2. According to an embodiment, the folding axis extending in the first direction DR1 is referred to as a first folding axis FX1, and the folding axis extending in the second direction DR2 is referred to as a second folding axis FX2. The display device DD may include one or a folding axis of the first and second folding axes FX1 and FX2. For example, the display device DD may be folded with respect to one of the first and second folding axes FX1 and FX2.

The display device DD may be applied to a large-sized electronic item, such as a television set and a monitor, and a small and medium-sized electronic item, such as a mobile phone, a tablet computer, a car navigation unit, and a game unit. These are merely examples, and thus, the display device DD may be applied to other electronic items as long as they do not depart from the disclosure.

As shown in FIG. 1, the display device DD may display an image IM on a display surface IS substantially parallel to each of the first and second directions DR1 and DR2 toward a third direction DR3. The display surface IS on which the image IM is displayed may correspond to a front surface of the display device DD. As an example, the first direction DR1 may be substantially perpendicular to the second direction DR2. The third direction DR3 may be substantially perpendicular to the first direction DR1 and the second direction DR2.

The display surface IS of the display device DD may be divided into areas. The display surface IS of the display device DD may include a transmission area TA and a bezel area BZA, which are defined therein. The transmission area TA may be an area through which the image IM is displayed. A user may view the image IM through the transmission area TA. In an embodiment, the transmission area TA may have a substantially quadrangular shape with substantially rounded vertices, however, this is merely one example. The transmission area TA may have a variety of shapes and should not be particularly limited.

The bezel area BZA may be defined adjacent to the transmission area TA. The bezel area BZA may have a color. The bezel area BZA may surround or may be adjacent to the transmission area TA. Accordingly, the transmission area TA may be defined by the bezel area BZA. However, this is merely one example, and the bezel area BZA may be disposed to be adjacent to one side or a side of the transmission area TA or may be omitted. According to an embodiment, the display device DD should not be particularly limited.

Figure 2A:
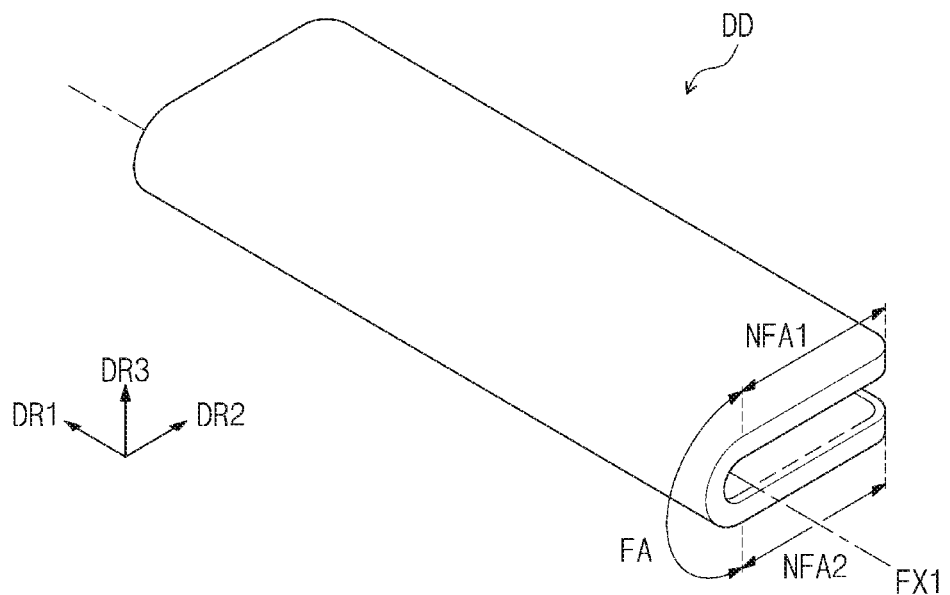
FIG. 2A is a schematic perspective view showing a state in which the display device shown in FIG. 1 is inwardly folded (in-folding) with respect to a first folding axis.
Figure 2B:
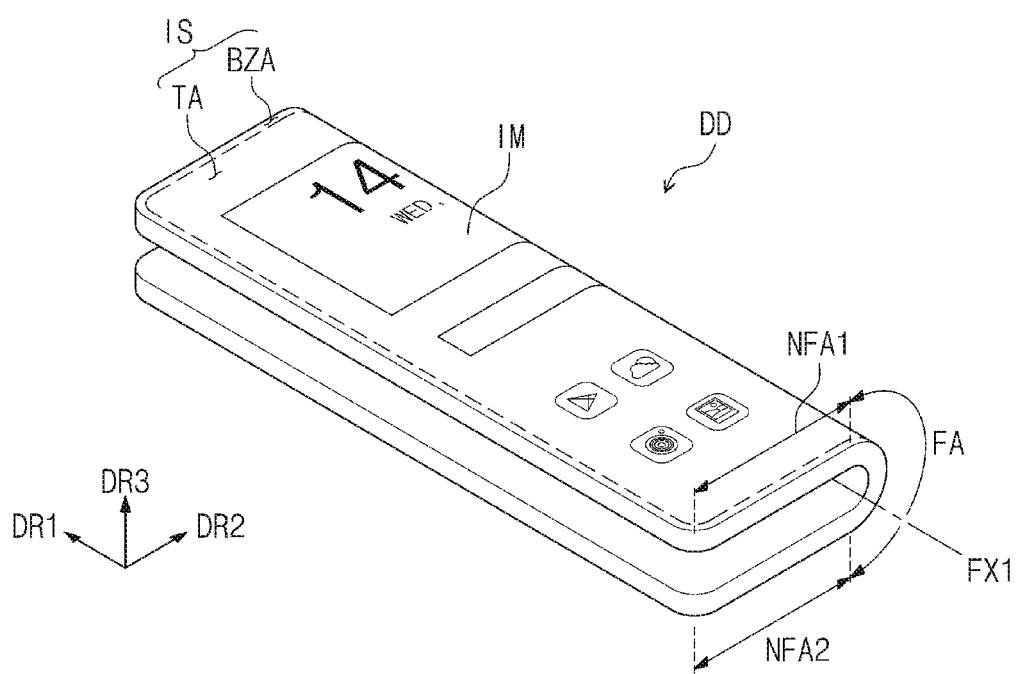
FIG. 2B is a schematic perspective view showing a state in which the display device shown in FIG. 1 is outwardly folded (out-folding) with respect to the first folding axis.

FIG. 2A is a schematic perspective view showing a state in which the display device DD shown in FIG. 1 is inwardly folded (in-folding) with respect to the first folding axis, and FIG. 2B is a schematic perspective view showing a state in which the display device DD shown in FIG. 1 is outwardly folded (out-folding) with respect to the first folding axis.

Referring to FIGS. 1 and 2A, the display device DD may include areas defined therein according to its operation mode. The areas may include a folding area FA and at least one non-folding area NFA1 and NFA2. As an example, the display device DD may include two non-folding areas NFA1 and NFA2 and the folding area FA defined between two non-folding areas NFA1 and NFA2.

As an example, the non-folding areas NFA1 and NFA2 may include a first non-folding area NFA1 and a second non-folding area NFA2. The first non-folding area NFA1 may be disposed adjacent to one side or a side of the folding area FA in the second direction DR2, and the second non-folding area NFA2 may be disposed adjacent to the other side of the folding area FA in the second direction DR2. The folding area FA may be folded with respect to the first folding axis FX1 to form a curvature. The first folding axis FX1 may extend in the first direction DR1, for example, a major axis direction of the display device DD.

The display device DD may be inwardly folded (in-folding) or outwardly folded (out-folding). In the disclosure, the in-folding indicates a state in which the display device is folded to allow a portion of the display surface IS to face the other portion of the display surface IS, and the out-folding indicates a state in which the display device DD is folded to allow a portion of a rear surface to face the other portion of the rear surface.

The display device DD shown in FIG. 2A may be inwardly folded (in-folding) to allow the display surface IS of the first non-folding area NFA1 to face the display surface IS of the second non-folding area NFA2.

Referring to FIG. 2B, the display device DD may be outwardly folded (out-folding) with respect to the first folding axis FX1. In case that the display device DD is outwardly folded, the display surface IS may be exposed to the outside.

The display device DD may be folded to be in the in-folding state or to be in the out-folding state, however, the display device DD may be only inwardly folded or may be only outwardly folded.

Figure 3A:
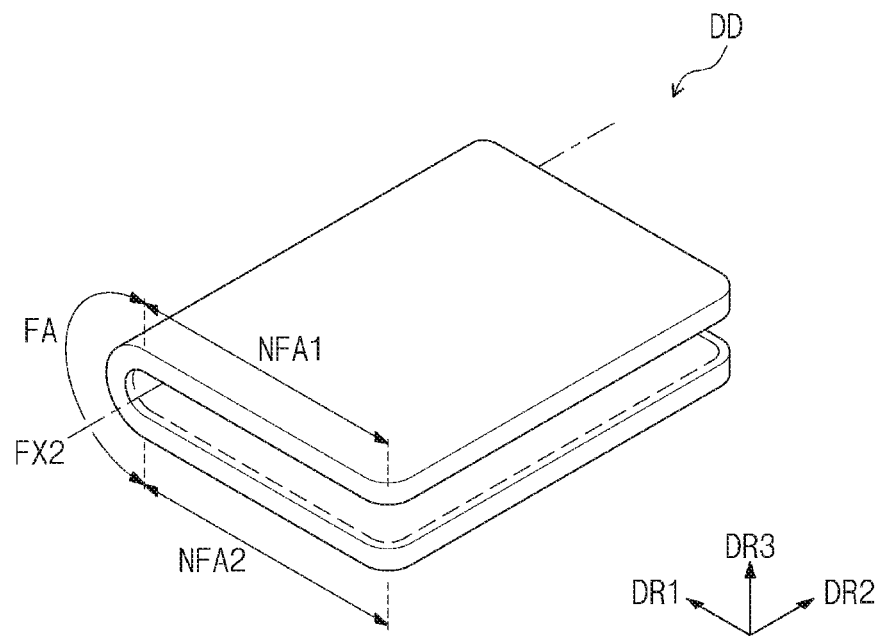
FIG. 3A is a schematic perspective view showing a state in which the display device shown in FIG. 1 is inwardly folded (in-folding) with respect to a second folding axis.
Figure 3B:
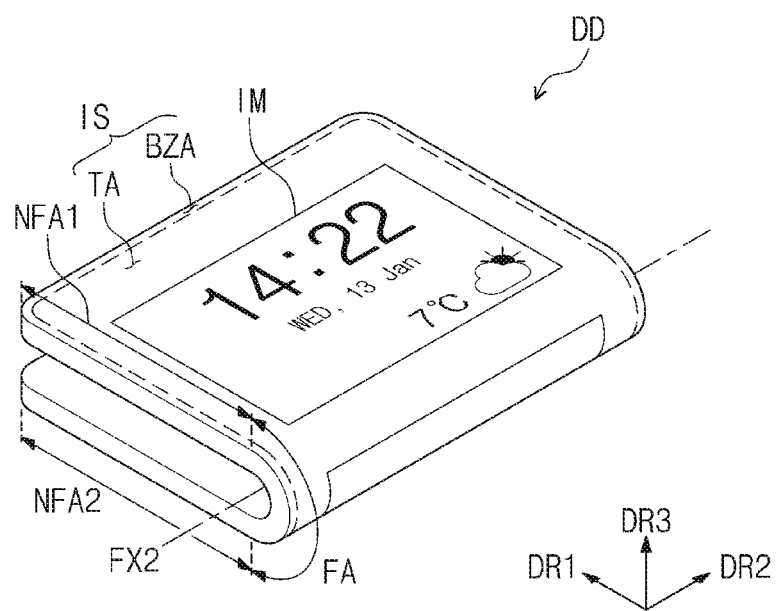
FIG. 3B is a schematic perspective view showing a state in which the display device shown in FIG. 1 is outwardly folded (out-folding) with respect to the second folding axis.

FIG. 3A is a schematic perspective view showing a state in which the display device DD shown in FIG. 1 is inwardly folded (in-folding) with respect to the second folding axis FX2, and FIG. 3B is a schematic perspective view showing a state in which the display device DD shown in FIG. 1 is outwardly folded (out-folding) with respect to the second folding axis FX2.

As an example, the first non-folding area NFA1 may be disposed adjacent to one side or a side of the folding area FA in the first direction DR1, and the second non-folding area NFA2 may be disposed adjacent to the other side of the folding area FA in the first direction DR1. The folding area FA is folded with respect to the second folding axis FX2 to form a curvature. The second folding axis FX2 may extend in the second direction DR2, for example, a minor axis direction.

The display device DD may be inwardly or outwardly folded with respect to the second folding axis FX2.

The display device DD may include the first and second folding axes FX1 and FX2 and may be folded in the minor direction and the major direction. However, according to an embodiment, the display device DD may include only one or a folding axis of the first and second folding axes FX1 and FX2.

In an embodiment, one or a folding area FA is defined in the display device DD, however, the disclosure should not be limited thereto or thereby. According to an embodiment, folding areas may be defined in the display device DD.

Figure 4:
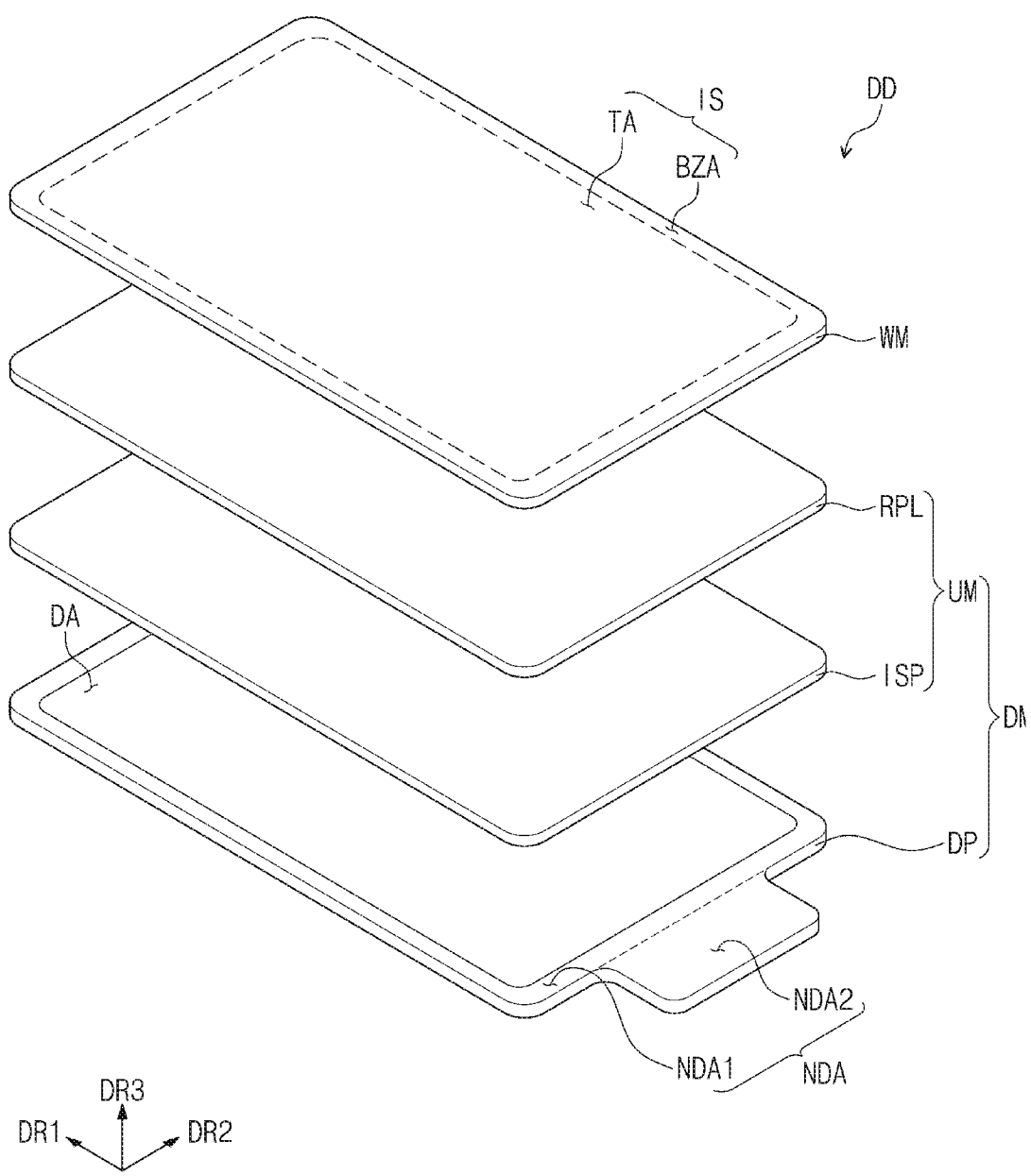
FIG. 4 is an exploded schematic perspective view showing a display device according to an embodiment.

FIG. 4 is an exploded schematic perspective view showing the display device DD according to an embodiment.

Referring to FIG. 4, the display device DD may include a display module DM and a window WM disposed on the display module DM. The display module DM may include a display panel DP and an upper module UM.

The display panel DP may be a light-emitting type display panel, however, it should not be particularly limited. For instance, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as a representative example of the display panel DP. The display panel DP may output the image IM, and the output image may be displayed through the display surface IS.

The display panel DP may be a flexible display panel. Accordingly, the display panel DP may be folded or unfolded with respect to the first folding axis FX1 (refer to FIG. 1) or the second folding axis FX2 (refer to FIG. 1).

The display panel DP may include a display area DA through which the image is displayed and a non-display area NDA defined adjacent to the display area DA. As an example, the non-display area NDA may include a first non-display area NDA1 and a second non-display area NDA2. As an example, the first non-display area NDA1 may surround or may be adjacent to the display area DA, however, this is merely one example. According to an embodiment, the first non-display area NDA1 may have a variety of shapes and should not be particularly limited. A driving chip (not shown) required to drive the display panel DP may be disposed in the second non-display area NDA2. The second non-display area NDA2 may be bent and disposed on a rear surface of the display panel DP. According to an embodiment, the display area DA of the display panel DP may correspond to at least a portion of the transmission area TA.

The upper module UM may include various members. As an example, the upper module UM may include an anti-reflective layer RPL and an input sensor layer ISP.

The anti-reflective layer RPL may be disposed on the display panel DP. The anti-reflective layer RPL may be folded with respect to the first folding axis FX1 or the second folding axis FX2 with the display panel DP.

The anti-reflective layer RPL may prevent components of the display panel DP from being viewed from the outside due to a light incident into the display panel through the front surface of the display device DD. The anti-reflective layer RPL may include a polarizer film and/or a retarder film. The number of the retarder films and a phase delay length ($\lambda/2$ or a $\lambda/4$) of the retarder film may be determined according to the principle of operation of the anti-reflective layer RPL, however, the disclosure should not be limited thereto or thereby. The anti-reflective layer RPL may include color filters and light blocking patterns disposed between the color filters.

The input sensor layer ISP may sense an external input by a capacitance method, a pressure sensing method, or an electromagnetic induction method. The input sensor layer ISP may be formed or disposed on the display panel DP through successive processes. The input sensor layer ISP and the display panel DP may be coupled or connected with each other by an adhesive film. The input sensor layer ISP is not manufactured together with the display panel DP through the successive processes. For example, the input sensor layer ISP may be fixed to an upper surface of the display panel DP by the adhesive film after being manufactured through a separate process from the display panel DP.

The window WM may include a transparent material that transmits the image IM (refer to FIG. 1). For example, the window WM may include a glass, sapphire, or plastic material. The window WM may have a single-layer structure, however, it should not be limited thereto or thereby, and the window WM may include layers.

An upper surface of the window WM may define the display surface IS of the display device DD. The window WM may be optically transparent. Thus, the image generated by the display panel DP may be easily viewed by the user after passing through the window WM.

The bezel area BZA of the display device DD may be defined by printing a material having a color on an area of the window WM. As an example, the window WM may include a light blocking pattern to define the bezel area BZA. The light blocking pattern may be a colored organic layer and may be formed by a coating method.

Figure 5:
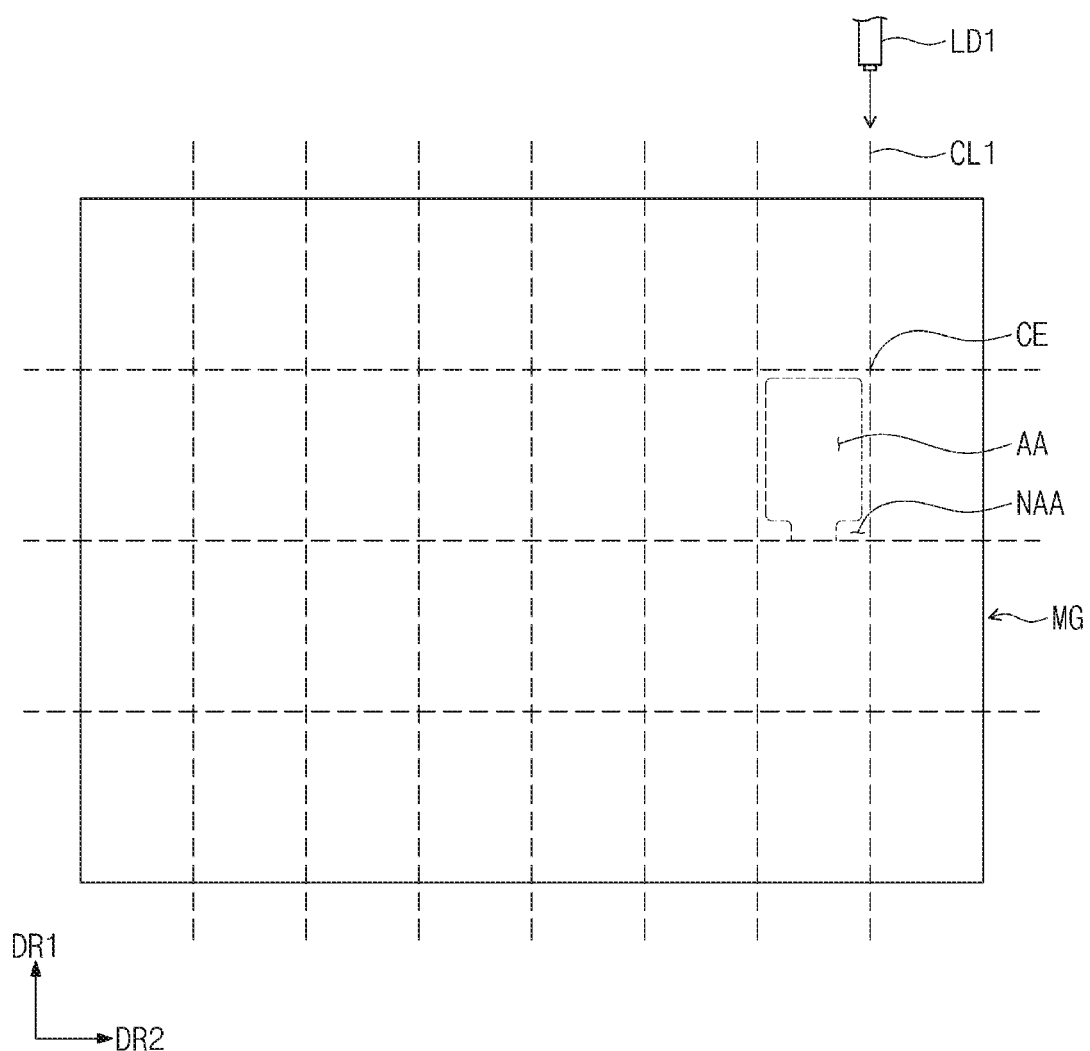
FIG. 5 is a view showing a first cutting process according to an embodiment.
Figure 6:
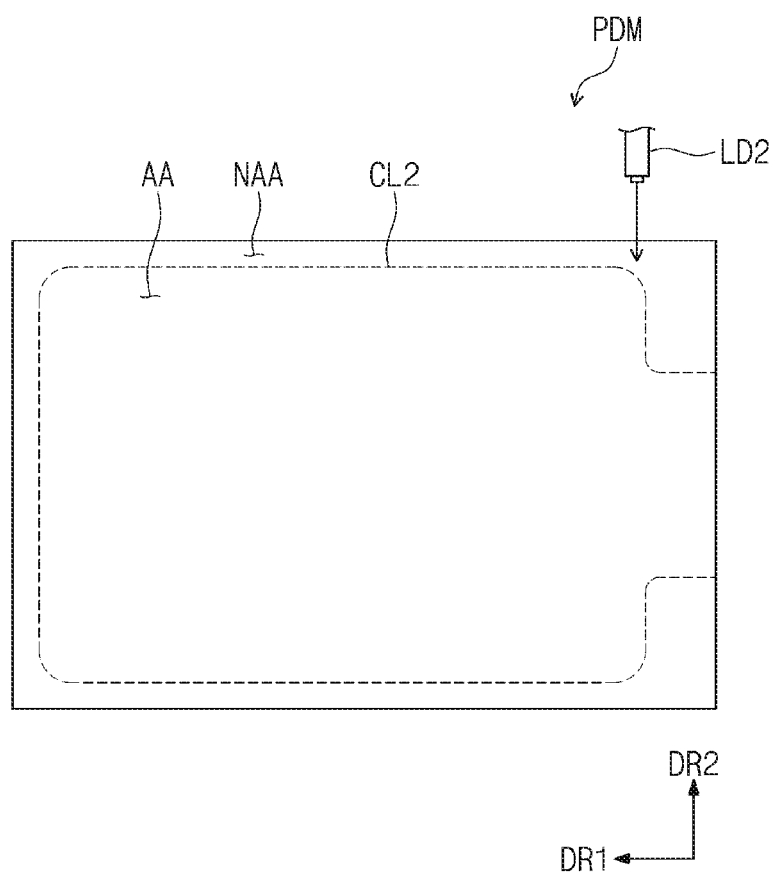
FIG. 6 is a view showing a second cutting process according to an embodiment.

FIG. 5 is a view showing a first cutting process according to an embodiment, and FIG. 6 is a view showing a second cutting process according to an embodiment.

Referring to FIG. 5, a substrate MG in which cell areas CE is defined is prepared. Each of the cell areas CE may include an effective area AA and a non-effective area NAA.

The first cutting process may be performed along a first cutting line CL1 surrounding each cell area CE to form preliminary display modules PDM (refer to FIG. 6) from the substrate MG. As an example, the first cutting line CL1 may extend along the first direction DR1 and the second direction DR2. Accordingly, the first cutting process may be performed in the first direction DR1 and the second direction DR2.

As an example, the first cutting process may be performed using a first laser LD1 having a first wavelength. The first cutting process may be performed by moving the substrate MG while fixing a position of the first laser LD1, however, it should not be particularly limited. For example, the first cutting process may be performed by moving the first laser LD1 while fixing the substrate MG.

Referring to FIG. 6, each preliminary display module PDM formed by the first cutting process is prepared. The second cutting process may be performed along a second cutting line CL2 positioned or disposed at a boundary between the effective area AA and the non-effective area NAA included in each preliminary display module PDM, and thus, the non-effective area NAA may be removed from the effective area AA.

As an example, the second cutting process may be performed using a second laser LD2 having a second wavelength different from the first wavelength. As an example, the second wavelength may be smaller than the first wavelength. The second cutting process may be performed by moving the second laser LD2 while fixing the position of each preliminary display module PDM, however, it should not be particularly limited.

Referring to FIGS. 4 to 6, the display module DM may be manufactured through the first and second cutting processes. As an example, the substrate MG may include a first layer including preliminary display panels respectively corresponding to the cell areas CE and a second layer including preliminary input sensor layers respectively corresponding to the cell areas CE. Each preliminary display module PDM including the preliminary display panel and the preliminary input sensor layer may be prepared through the first cutting process. A preliminary anti-reflective layer including the anti-reflective layer RPL may be disposed on the prepared each preliminary display module PDM. The display module DM may be obtained by removing the non-effective area NAA from the preliminary display module PDM through the second cutting process.

The window WM may be disposed above the display module DM obtained through the second cutting process, however, it should not be limited thereto or thereby. According to an embodiment, the window WM may be disposed on the preliminary display module PDM, and the display device DD may be obtained through the second cutting process.

In FIGS. 5 and 6, the first cutting process and the second cutting process are performed by different cutting devices from each other, however, they should not be limited thereto or thereby. According to an embodiment, the first and second cutting processes may be performed by one cutting device.

Figure 7:
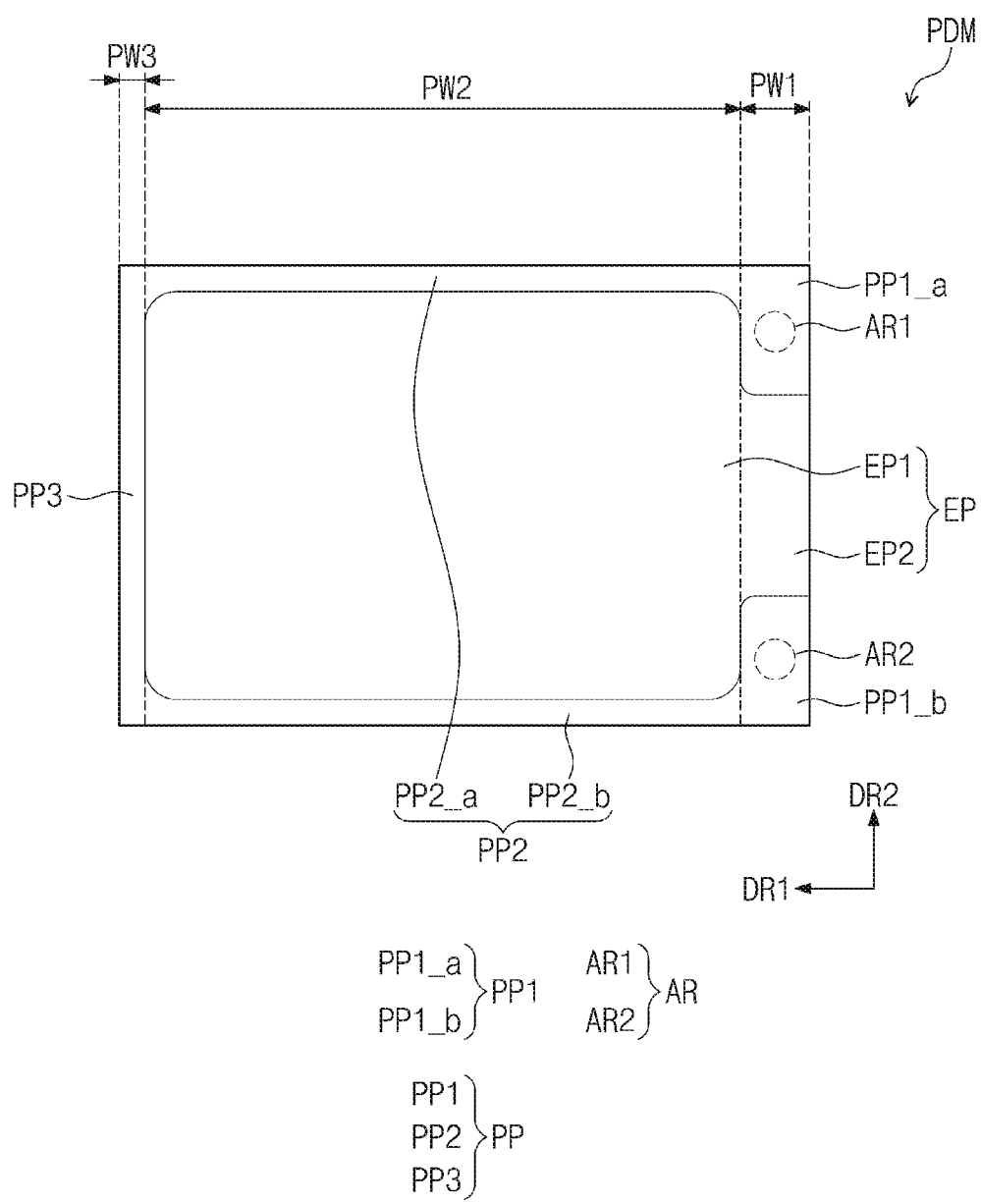
FIG. 7 is a schematic plan view showing a preliminary display module according to an embodiment.

FIG. 7 is a schematic plan view showing the preliminary display module PDM according to an embodiment.

Referring to FIG. 7, the preliminary display module PDM cut along the second cutting line CL2 (refer to FIG. 6) may include an effective portion EP and a dummy portion PP_around the effective portion EP. The effective portion EP may correspond to the effective area AA (refer to FIG. 6), and the dummy portion PP may correspond to the non-effective area NAA (refer to FIG. 6).

As an example, the effective portion EP may include a first effective portion EP1 and a second effective portion EP2. The first effective portion EP1 may correspond to the display area DA (refer to FIG. 4) and the first non-display area NDA1 (refer to FIG. 4). The second effective portion EP2 may correspond to the second non-display area NDA2 (refer to FIG. 4) and may be bent.

As an example, the dummy portion PP may include a first dummy portion PP1, a second dummy portion PP2, and a third dummy portion PP3.

The first dummy portion PP1 may be disposed at one side or a side of the preliminary display module PDM. The first dummy portion PP1 may include a first sub-dummy portion PP1_a and a second sub-dummy portion PP1_b. The first sub-dummy portion PP1_a and the second sub-dummy portion PP1_b may be spaced apart from each other with the second effective portion EP2 interposed therebetween. As an example, the first sub-dummy portion PP1_a and the second sub-dummy portion PP1_b may be spaced apart from each other with the second effective portion EP2 interposed therebetween in the second direction DR2 (for example, a third moving direction).

The first dummy portion PP1 may include a point (for example, a specific point or a selected point) AR to be picked by a picker PK (refer to FIG. 8A) of a dummy removal device PRD (refer to FIG. 8A) described later.

As an example, the specific point AR may be disposed at the one side or a side of the preliminary display module PDM. As an example, the specific point AR may include a first point AR1 and a second point AR2. The first point AR1 may be disposed at the one side or a side of the preliminary display module PDM, and the second point AR2 may be spaced apart from the first point AR1 in the second direction DR2. The first sub-dummy portion PP1_a may include the first point AR1, and the second sub-dummy portion PP1_b may include the second point AR2.

The first and second points AR1 and AR2 may be spaced apart from each other in a direction substantially parallel to a minor axis direction of the preliminary display module PDM, for example, the second direction DR2, and may be positioned or disposed at the one side or a side of the preliminary display module PDM to respectively correspond to positions of the first and second sub-dummy portions PP1_a and PP1_b, however, the disclosure should not be limited thereto or thereby. The first and second points may be spaced apart from each other in a direction substantially parallel to a major axis direction of the preliminary display module PDM, for example, the first direction DR1 (for example, a second moving direction) and may be position at one side or a side of the preliminary display module PDM to correspond to positions of first and second sub-dummy portions.

The third dummy portion PP3 may be disposed at the other side of the preliminary display module PDM. As an example, the third dummy portion PP3 may be spaced apart from the first dummy portion PP1 in the first direction DR1. As an example, the first and third dummy portions PP1 and PP3 may be spaced apart from each other in the direction substantially parallel to the major axis direction of the preliminary display module PDM, for example, the first direction DR1, and may be disposed at opposite ends of the preliminary display module PDM, however, the disclosure should not be limited thereto or thereby. According to an embodiment, the first and third dummy portions PP1 and PP3 may be spaced apart from each other in the direction substantially parallel to the minor axis direction of the preliminary display module PDM, for example, the second direction DR2, and may be disposed at opposite ends of the preliminary display module PDM.

The second dummy portion PP2 may be disposed between the first dummy portion PP1 and the third dummy portion PP3. As an example, the second dummy portion PP2 may include a third sub-dummy portion PP2_a and a fourth sub-dummy portion PP2_b. The third sub-dummy portion PP2_a and the fourth sub-dummy portion PP2_b may be spaced apart from each other in the second direction DR2 with the first effective portion EP1 interposed therebetween.

The first dummy portion PP1 may have a first dummy width PW1 in the first direction DR1, and the third dummy portion PP3 may have a third dummy width PW3 in the first direction DR1. The first dummy portion PP1 may be formed to include the first and second points AR1 and AR2, and thus, the first dummy width PW1 may be greater than the third dummy width PW3. The second dummy portion PP2 may have a second dummy width PW2 in the first direction DR1, and the second dummy width PW2 may be substantially the same as or may be equal to a width in the first direction DR1 of the first effective portion EP1.

Figure 8A:
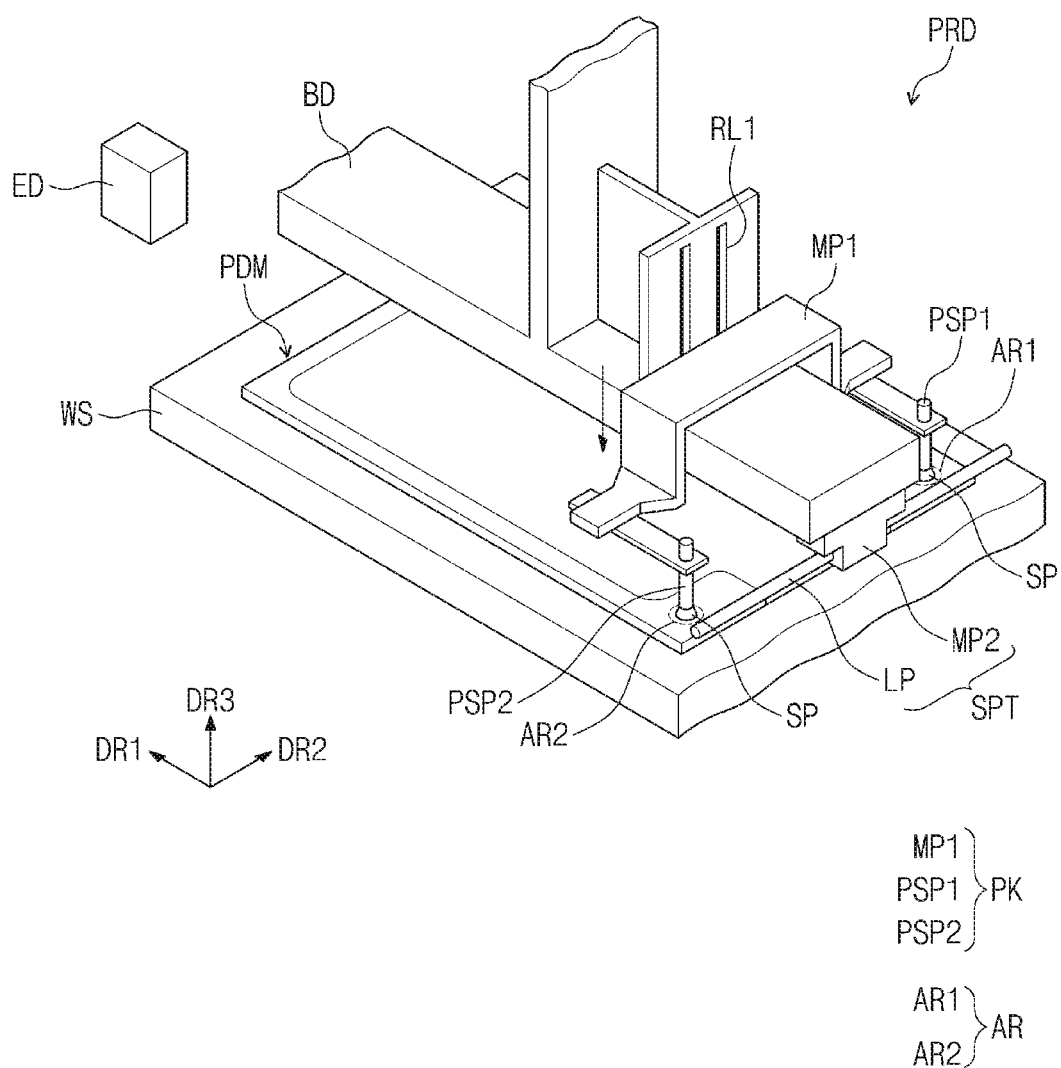
FIG. 8A is a schematic perspective view showing a dummy removal device according to an embodiment.
Figure 8B:
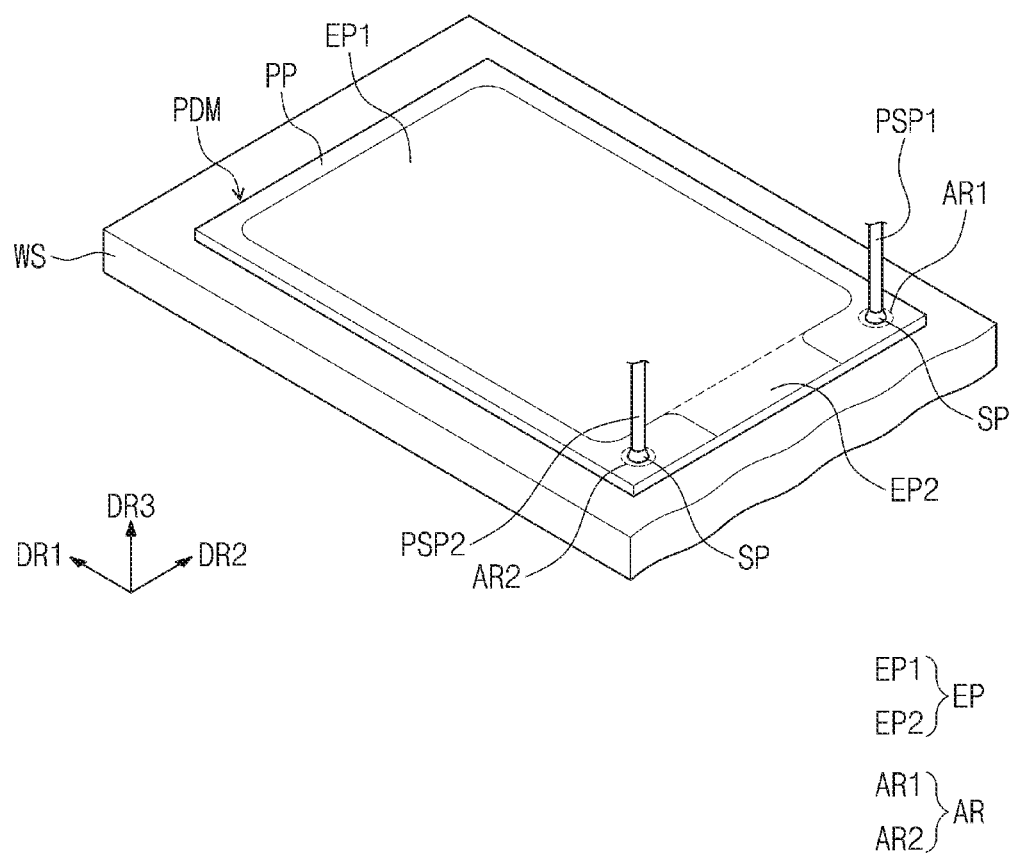
FIG. 8B is a schematic perspective view showing a state in which a dummy portion is picked by a picker of the dummy removal device shown in FIG. 8A.

FIG. 8A is a schematic perspective view showing the dummy removal device PRD according to an embodiment, and FIG. 8B is a schematic perspective view showing a state in which the dummy portion is picked by the picker PK of the dummy removal device PRD shown in FIG. 8A.

Referring to FIGS. 8A and 8B, the dummy removal device PRD may include a body BD, the picker PK, and a separator SPT.

In case that the preliminary display module PDM is disposed on a work table WS, the dummy removal device PRD may be disposed above the preliminary display module PDM. The dummy removal device PRD may remove the dummy portion PP (refer to FIG. 7) from the preliminary display module PDM disposed on the work table WS.

As an example, the body BD may include a first rail RL1 extending in the third direction DR3 and a second rail (not shown) extending in the first direction DR1.

The picker PK may be connected to the body BD and may move along the first rail RL1 in the third direction DR3 (for example, a first moving direction substantially perpendicular to the second moving direction) and a direction opposite to the third direction DR3. The picker PK may move in the direction opposite to the third direction DR3 to pick the specific point AR of the dummy portion PP. As an example, the picker PK may include an adsorption pad SP and may pick the specific point AR using a vacuum state between the adsorption pad SP and the specific point AR.

As an example, the picker PK may include a first moving tool MP1 connected to the body BD and moving in the third direction DR3 and the opposite direction to the third direction DR3, for example, a vertical direction, and picker adsorption portions PSP1 and PSP2 connected to the first moving tool MP1 and picking the specific point AR.

In detail, the picker adsorption portions PSP1 and PSP2 may include a first picker adsorption portion PSP1 to pick the first point AR1 and a second picker adsorption portion PSP2 to pick the second point AR2. Each of the first and second picker adsorption portions PSP1 and PSP2 may include the adsorption pad SP, however, the disclosure should not be limited thereto or thereby. In a case where the specific point AR may include three or more points, the picker PK may also include three or more picker adsorption portions.

The separator SPT may be connected to the body BD and may move in the first direction DR1 and a direction opposite to the first direction DR1 (for example, the second moving direction), along the second rail. The operation and configuration of the separator SPT will be described in detail with reference to FIGS. 10A to 11B.

The dummy removal device PRD may further include an error detector ED to determine whether the picker PK and the separator SPT are normally operated. As an example, the error detector ED may measure a magnitude of a force applied in case that the picker PK picks the specific point AR. In case that the measured magnitude of the force is referred to as a measured magnitude, the error detector ED may compare the measured magnitude with a magnitude (for example, a predetermined magnitude or a selected magnitude) to determine whether the picker PK is normally operated. In a case where the measured magnitude is equal to or greater than the predetermined magnitude, the error detector ED may determine that the picker PK is normally operated and may not transmit an error occurrence signal indicating an occurrence of errors to the dummy removal device PRD. On the other hand, in a case where the measured magnitude is smaller than the predetermined magnitude, the error detector ED may determine that the picker PK is abnormally operated and may transmit the error occurrence signal indicating the occurrence of errors to the dummy removal device PRD. The dummy removal device PRD may stop its operations in case that receiving the error occurrence signal from the error detector ED.

In case that it is determined that the picker PK is abnormally operated by the error detector ED, the separator SPT may be prevented from being operated, and thus, damages to the preliminary display module PDM may be prevented.

An operation of the error detector ED to determine whether the separator SPT is normally operated will be described in detail with reference to FIG. 10C.

Referring to FIGS. 5, 7, and 8A, the dummy removal device PRD may remove the dummy portion PP from the preliminary display module PDM using the specific point AR disposed at the one side or a side of the preliminary display module PDM by the picker PK and the separator SPT. The third dummy portion PP3 does not need to include the specific point. Accordingly, the third dummy width PW3 may be smaller than the first dummy width PW1, and thus, the number of the cell areas CE included in the substrate MG may increase. Consequently, the number of the display modules DM or the number of the display devices DD, which is obtained from the substrate MG through the first and second cutting processes, may increase, and as a result, a productivity of the manufacturing process of the display device DD may be improved.

Figure 9A:
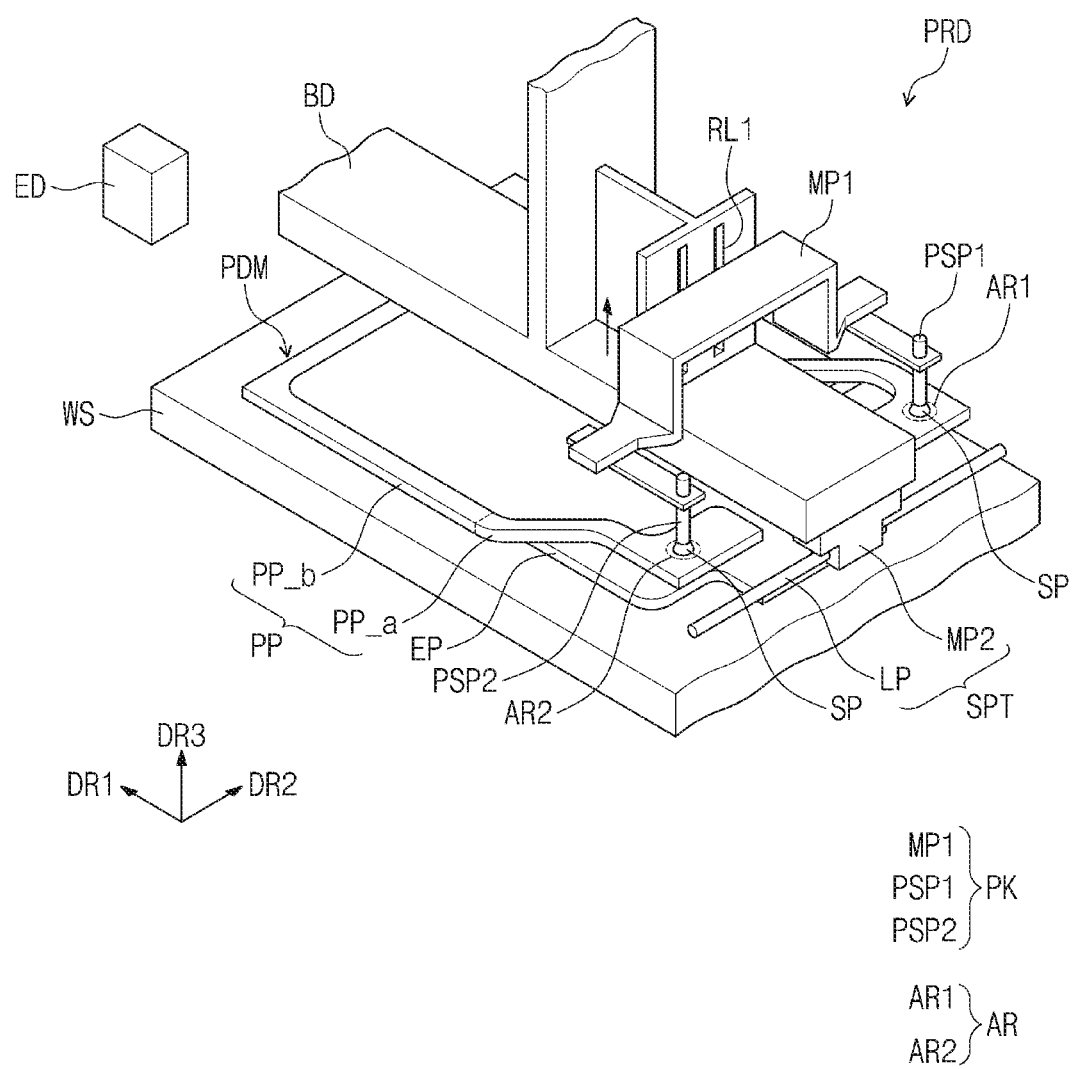
FIGS. 9A and 9B are schematic perspective views showing a state in which a first portion of a dummy portion is separated from a preliminary display module by a picker of a dummy removal device according to an embodiment.
Figure 9B:
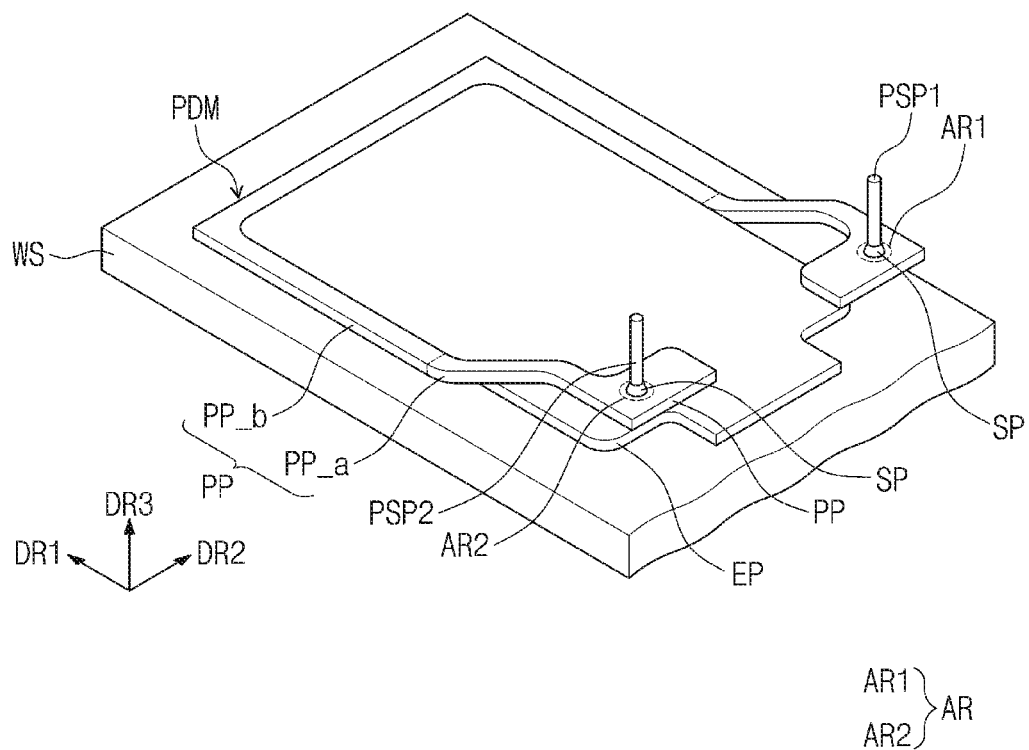

FIGS. 9A and 9B are schematic perspective views showing a state in which the first portion of the dummy portion is separated from the preliminary display module by the picker of the dummy removal device according to an embodiment.

Hereinafter, in FIGS. 9A and 9B, detailed descriptions of the same elements as those described with reference to FIGS. 8A and 8B will be omitted.

Referring to FIGS. 9A and 9B, the dummy portion PP may include a first portion PP_a and a second portion PP_b. The picker PK may pick the first and second points AR1 and AR2 of the dummy portion PP_and may move in the third direction DR3 (for example, the first moving direction) to separate the first portion PP_a of the dummy portion PP from the preliminary display module PDM. The second portion PP_b of the dummy portion PP may not be separated from the preliminary display module PDM by the picker PK and may be disposed on the work table WS.

Figure 10A:
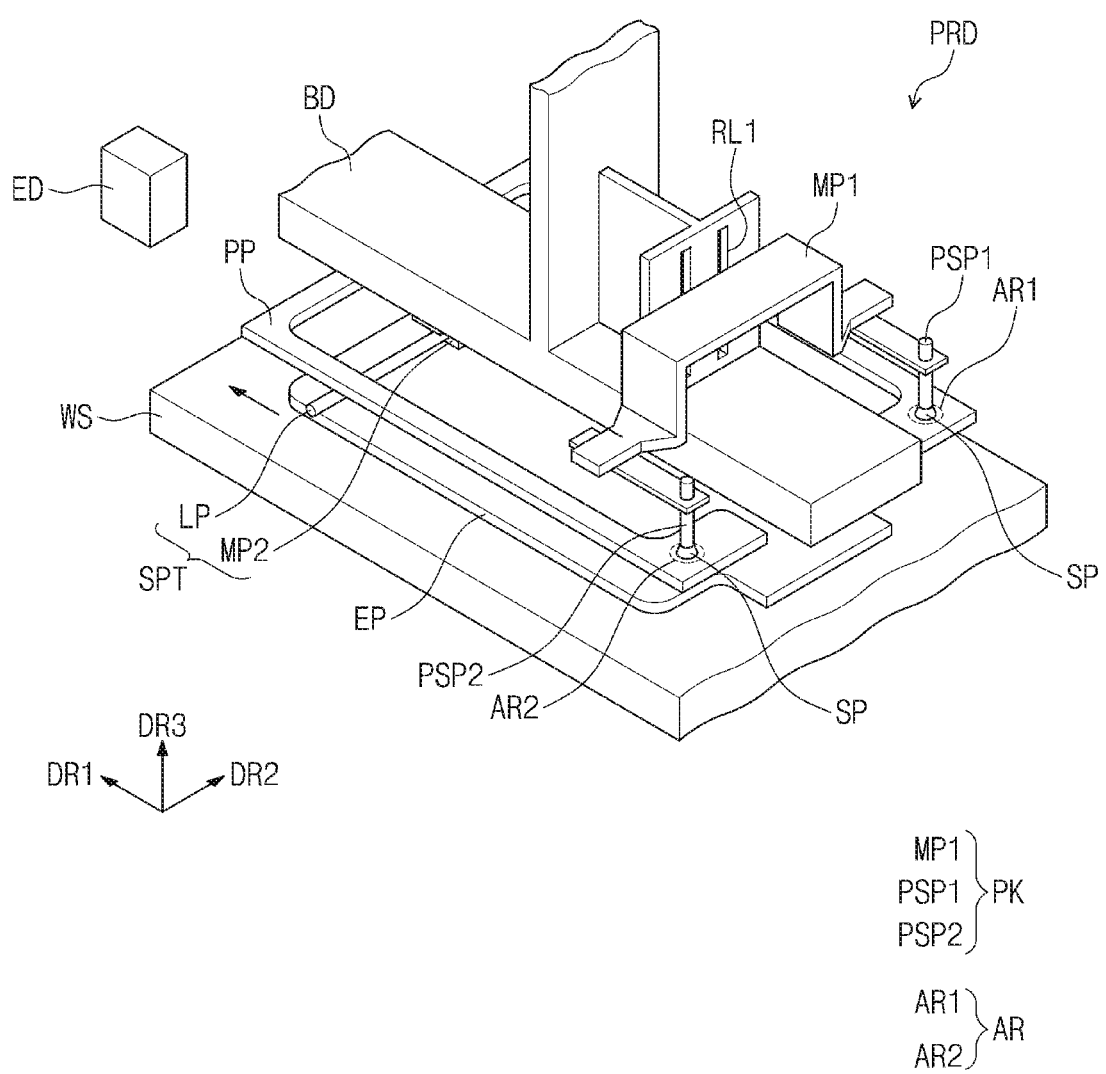
FIG. 10A is a schematic perspective view showing a state in which a second portion of a dummy portion is removed from a preliminary display module by a separator of a dummy removal device according to an embodiment.
Figure 10B:
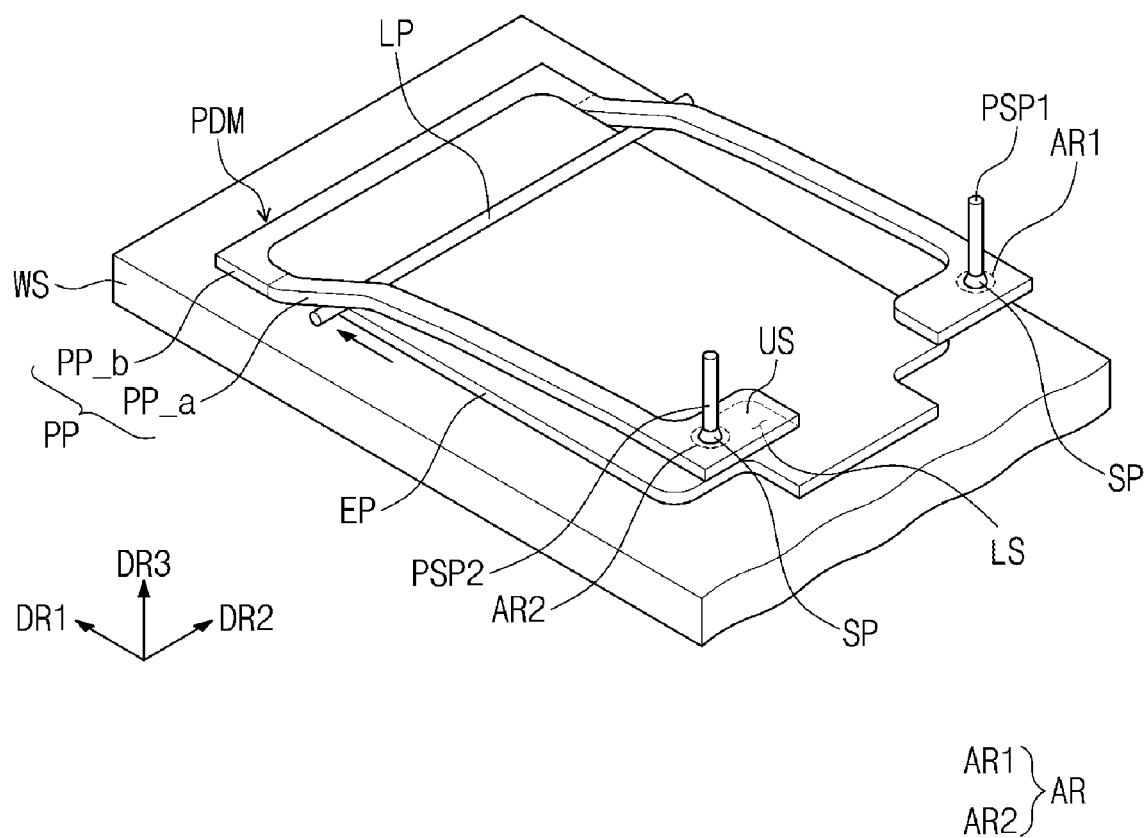
FIGS. 10B and 10C are schematic perspective views showing a state in which the second portion of the dummy portion is removed from the preliminary display module by the separator of the dummy removal device shown in FIG. 10A.
Figure 10C:
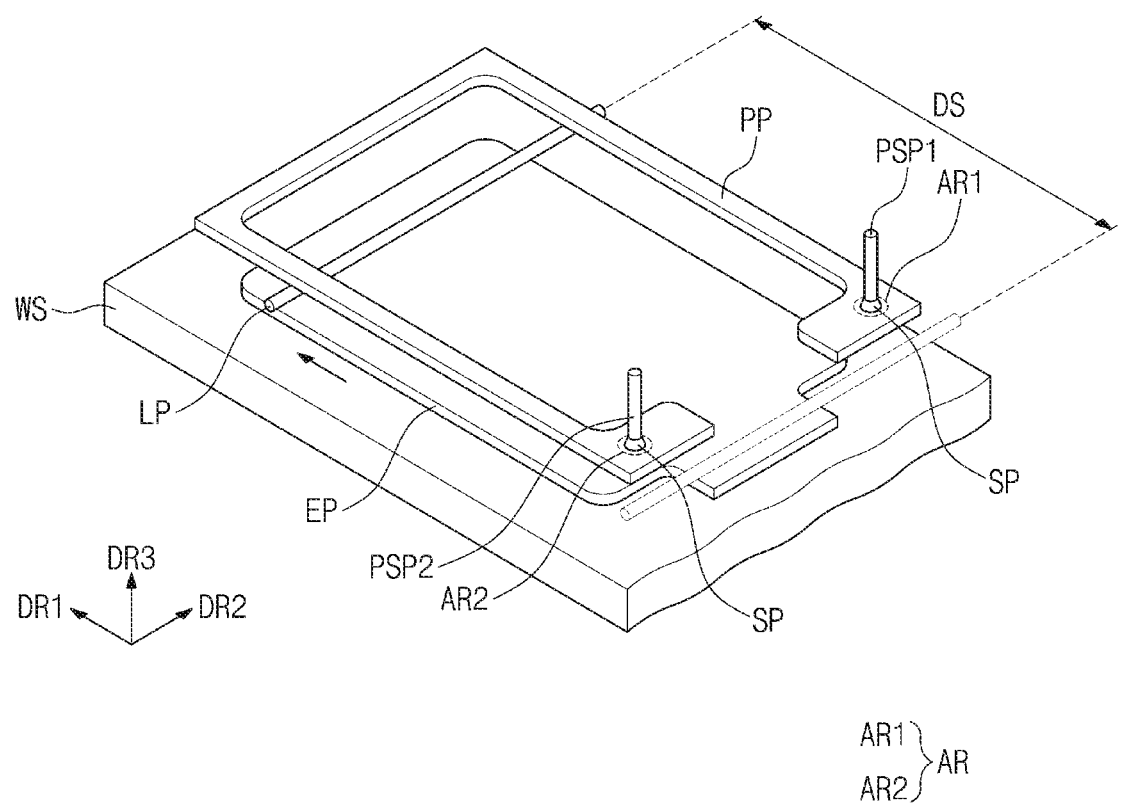

FIG. 10A is a schematic perspective view showing a state in which the second portion of the dummy portion is removed from the preliminary display module by the separator of the dummy removal device according to an embodiment, and FIGS. 10B and 10C are schematic perspective views showing a state in which the second portion of the dummy portion is removed from the preliminary display module by the separator of the dummy removal device shown in FIG. 10A.

Referring to FIGS. 10A to 10C, the separator SPT may include a second moving tool MP2 connected to the body BD and moving in the first direction DR1 or the opposite direction to the first direction DR1 and a lift portion LP connected to the second moving tool MP2 and moving in the first direction DR1 or the opposite direction to the first direction DR1.

As an example, the lift portion LP may move in the first direction DR1 while being disposed adjacent to the first portion PP_a separated by the picker PK. The second portion PP_b disposed on the work table WS may be separated from the preliminary display module PDM by the lift portion LP. Consequently, the dummy portion PP may be separated from the preliminary display module PDM by the picker PK and the separator SPT.

In detail, the picker PK may pick an upper surface US of the first portion PP_a, and, may separate the first portion PP_a from the preliminary display module PDM. The lift portion LP may be disposed adjacent to a lower surface LS of the first portion PP_a separated by the picker PK, may move in the first direction DR1, and may separate the second portion PP_b except the first portion PP_a of the dummy portion PP from the preliminary display module PDM.

As an example, the lift portion LP may have a shape extending in the second direction DR2 (for example, the third moving direction substantially perpendicular to the first and second moving directions). The lift portion LP may have a substantially cylindrical shape. Accordingly, the lift portion LP may be connected to the second moving tool MP2 connected to the body BD and may lift the dummy portion PP in the third direction DR3.

The error detector ED may determine whether the separator SPT is normally operated. In case that a distance DS in which the lift portion LP included in the separator SPT moves in the first direction DR1 is referred to as a travel distance DS, the error detector ED may compare the travel distance DS with a distance (for example, a predetermined distance or a selected distance) to determine whether the separator SPT is normally operated. In a case where the travel distance DS is equal to or greater than the predetermined distance, the error detector ED may determine that the separator SPT is normally operated and may not transmit a signal indicating occurrence of errors to the dummy removal device PRD. On the other hand, in a case where the travel distance DS is smaller than the predetermined distance, the error detector ED may determine that the separator SPT is abnormally operated and may transmit the signal indicating the occurrence of the errors to the dummy removal device PRD. The dummy removal device PRD may stop its operation in case that receiving the error occurrence signal from the error detector ED.

In case that it is determined that the separator SPT is abnormally operated by using the error detector ED, the operation of the dummy removal device PRD may be stopped, and thus, the preliminary display module PDM may be prevented from being damaged in a process of placing the removed dummy portion PP on a storage portion SR (refer to FIG. 12), which will be described later.

Figure 11A:
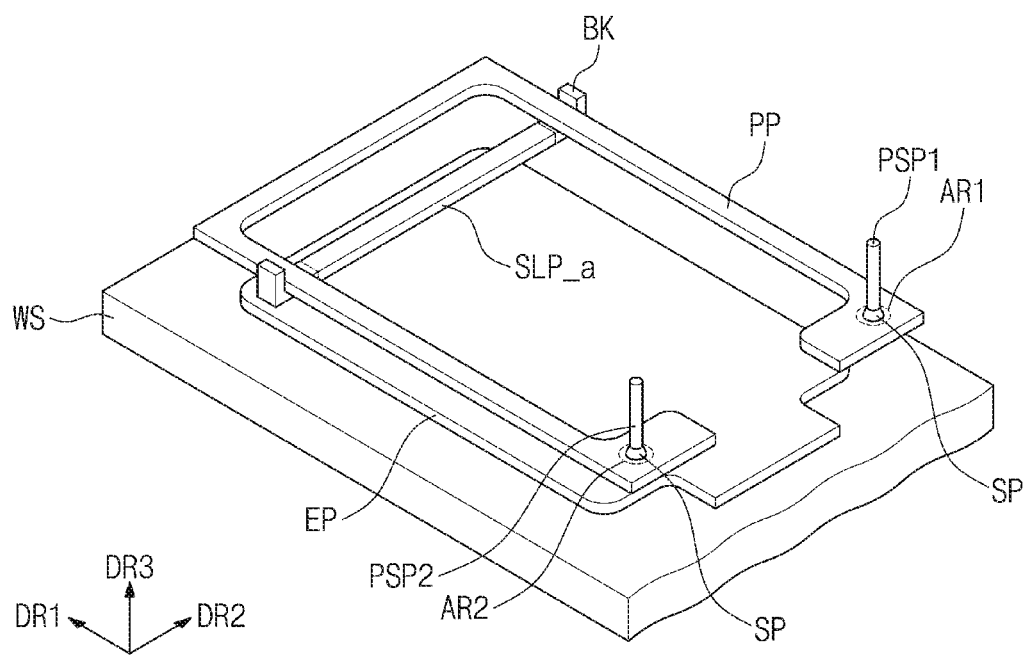
FIGS. 11A and 11B are views showing a shape of a lift portion included in a separator according to an embodiment.
Figure 11B:
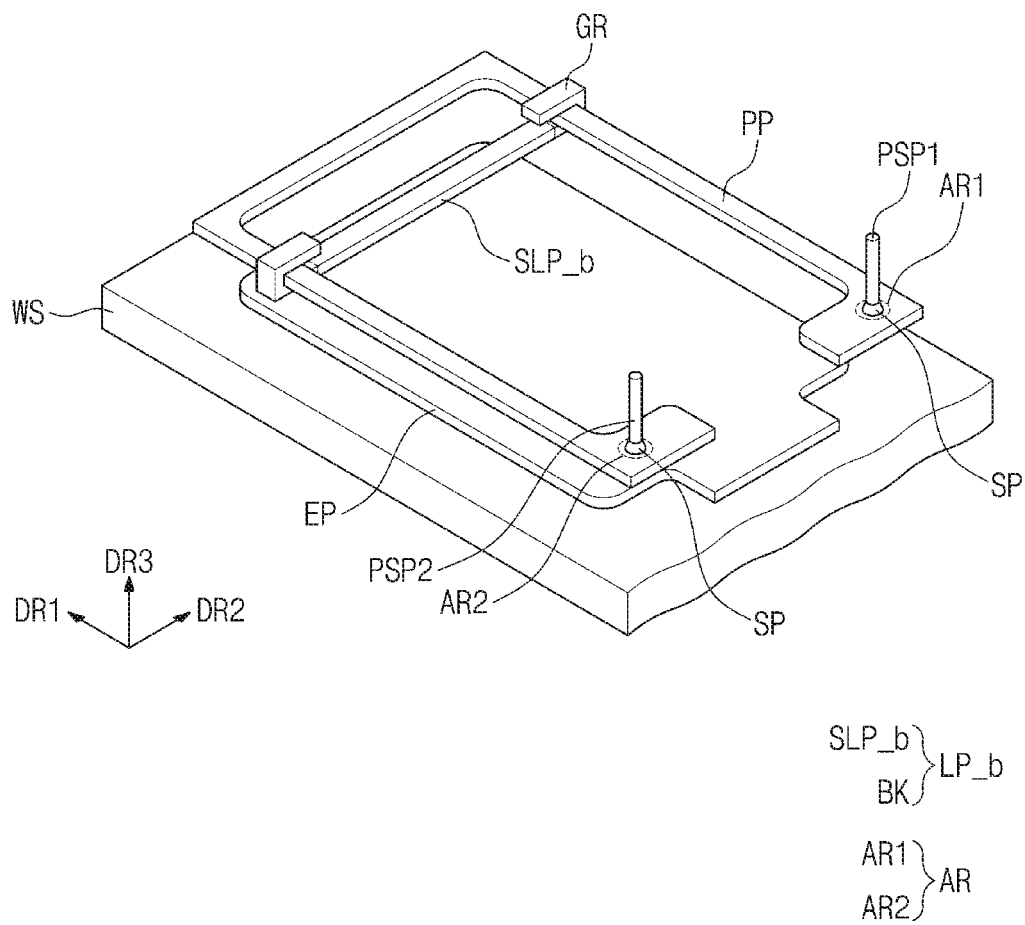

FIGS. 11A and 11B are views showing a configuration of lift portions LP_a and LP_b included in a separator according to an embodiment.

Referring to FIG. 11A, the lift portion LP_a may further include a straight portion SLP_a extending in the second direction DR2 and block portions BK extending in the third direction DR3 at opposite ends of the straight portion SLP_a. In case that the lift portion LP_a further may include the block portions BK, the block portions BK may allow the first portion PP_a (refer to FIG. 10B) not to move in the second direction DR2 in the process of separating the second portion PP_b (refer to FIG. 10B), and thus, damages to the effective portion EP by the first portion PP_a may be prevented. As an example, the block portions BK may be disposed adjacent to side surfaces of the first portion PP_a (refer to FIG. 10B).

Referring to FIG. 11B, the lift portion LP_b may include a straight portion SLP_b extending in the second direction DR2 and a grip portion GR disposed adjacent to a side surface and the lower surface LS (refer to FIG. 10B) of the first portion PP_a separated by the picker PK. Although not shown in figures, the grip portion GR may have a structure to grip the separated first portion PP_a. The grip portion GR may allow the first portion PP_a not to move in the second direction DR2 in the process of separating the second portion PP_b (refer to FIG. 10B), and thus, damages to the effective portion EP by the first portion PP_a (refer to FIG. 10B) may be prevented.

Figure 12:
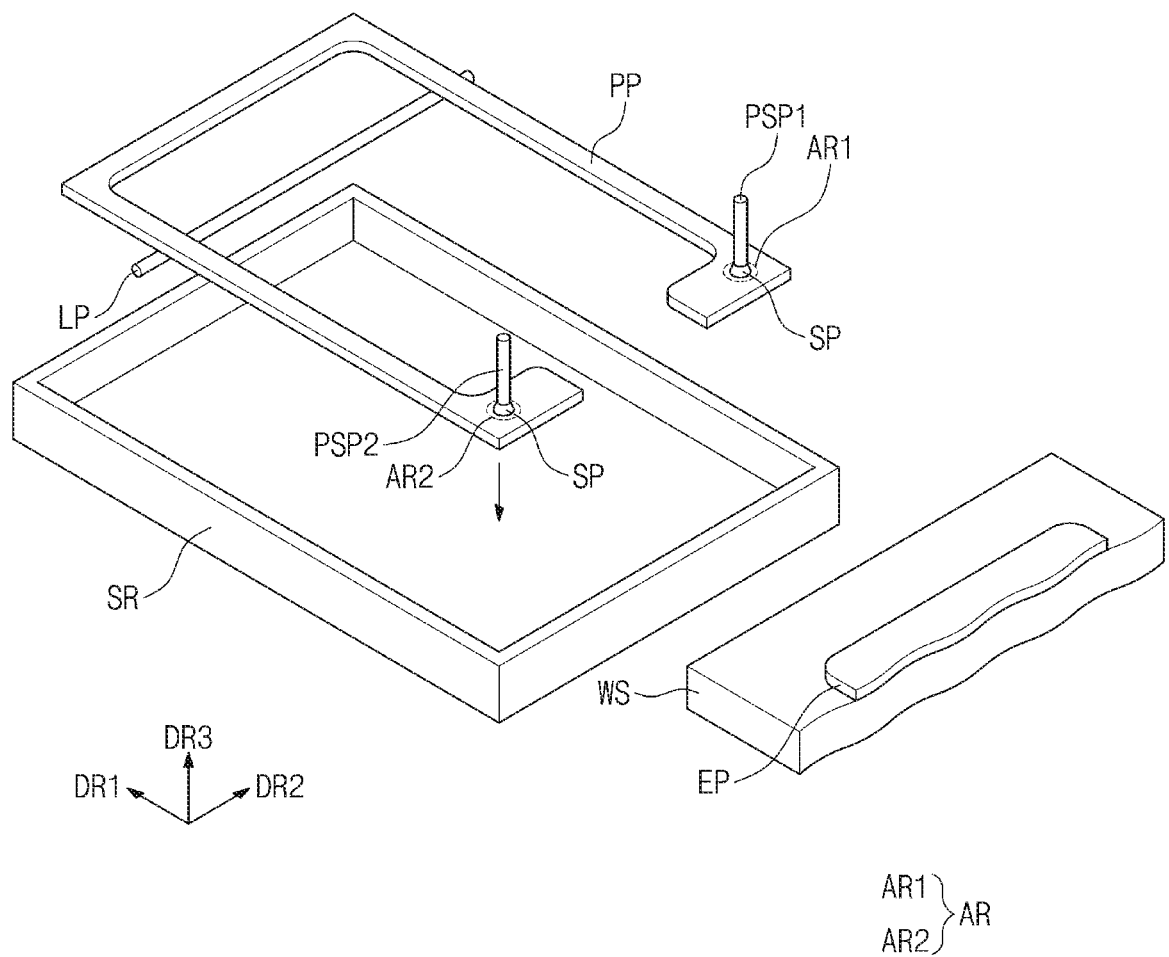
FIG. 12 is a schematic perspective view showing a storage portion in which the dummy portion separated by the dummy removal device is stored according to an embodiment.

FIG. 12 is a schematic perspective view showing the storage portion SR in which the dummy portion separated by the dummy removal device is stored according to an embodiment.

Referring to FIGS. 8A and 12, after the dummy portion PP is removed from the preliminary display module PDM, the dummy removal device PRD may place the removed dummy portion PP on the storage portion SR. The dummy removal device PRD may remove the dummy portion PP from the preliminary display module PDM using the picker PK and the separator SPT, which are connected to the body BD, and may move the body BD in the first direction DR1. After the body BD moves in the first direction DR1, the picker PK may decrease a force of the first picker adsorption portion PSP1, which is applied to pick the first point AR1, and a force of the second picker adsorption portion PSP2, which is applied to pick the second point AR2, and may place the dummy portion PP on the storage portion SR. The dummy removal device PRD may move the body BD in the opposite direction to the first direction DR1 to perform the process of removing the dummy portion PP from the preliminary display module PDM again. FIG. 12 shows the storage portion SR disposed at a position spaced apart from the work table WS in the first direction DR1, however, the disclosure should not be limited thereto or thereby. The storage portion SR may be disposed adjacent to the work table WS, and the dummy removal device PRD may move the body BD to the position at which the storage portion SR is disposed, which is adjacent to the work table WS, to perform the process of removing the dummy portion PP from the preliminary display module PDM.

Figure 13A:
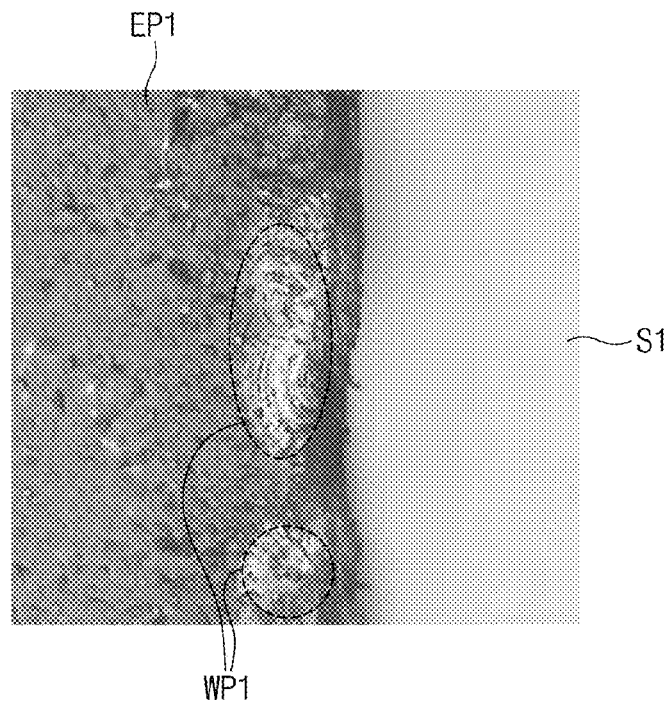
FIGS. 13A and 13B are images showing a boundary of an effective portion from which the dummy portion is removed in the preliminary display module.
Figure 13B:
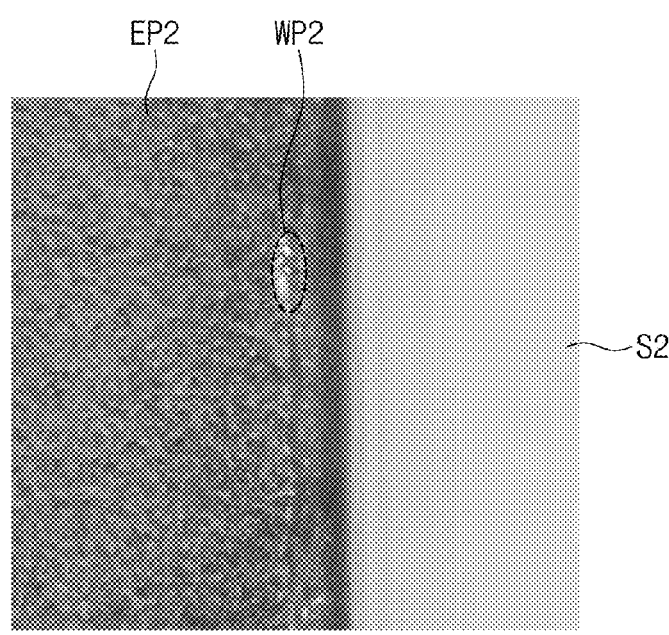

FIGS. 13A and 13B are images S1 and S2 showing a boundary of the effective portion from which the dummy portion is removed in the preliminary display module.

Referring to FIGS. 8A, 13A and 13B, the first image S1 shows the boundary of the first effective portion EP1 in a case where the dummy portion PP is removed from the preliminary display module PDM using only the picker PK that picks the specific point AR (refer to FIG. 7) disposed at one side or a side of the preliminary display module PDM.

The second image S2 shows the boundary of the second effective portion EP2 in a case where the dummy portion PP is removed from the preliminary display module PDM using the dummy removal device PRD including the picker PK that picks the specific point AR disposed at one side or a side of the preliminary display module PDM and the separator SPT.

First white stains WP1 are perceived in the first effective portion EP1 of the first image S1, and second white stains WP2 are perceived in the second effective portion EP2 of the second image S2. The first white stains WP1 are generated in case that the first effective portion EP1 is damaged in the process of removing the dummy portion PP from the preliminary display module PDM. The second white stains WP2 are generated in case that the second effective portion EP2 is damaged in the process of removing the dummy portion PP from the preliminary display module PDM.

Referring to FIGS. 13A and 13B, the first white stains WP1 are perceived to be greater than the second white stains WP2. In the case where the dummy portion PP is removed from the preliminary display module PDM using only the picker PK, a portion of the dummy portion PP, which is not adjacent to the specific point AR picked by the picker PK, may be removed from the first effective portion EP1 without being properly separated from the first effective portion EP1. Accordingly, the damage to the first effective portion EP1 may be large. On the other hand, in the case where the dummy portion PP is removed from the preliminary display module PDM using both the picker PK and the separator SPT, the entire portion of the dummy portion PP may be removed from the second effective portion EP2 while being properly separated from the second effective portion EP2. Accordingly, the damage to the second effective portion EP2 may be small.

Figure 14:
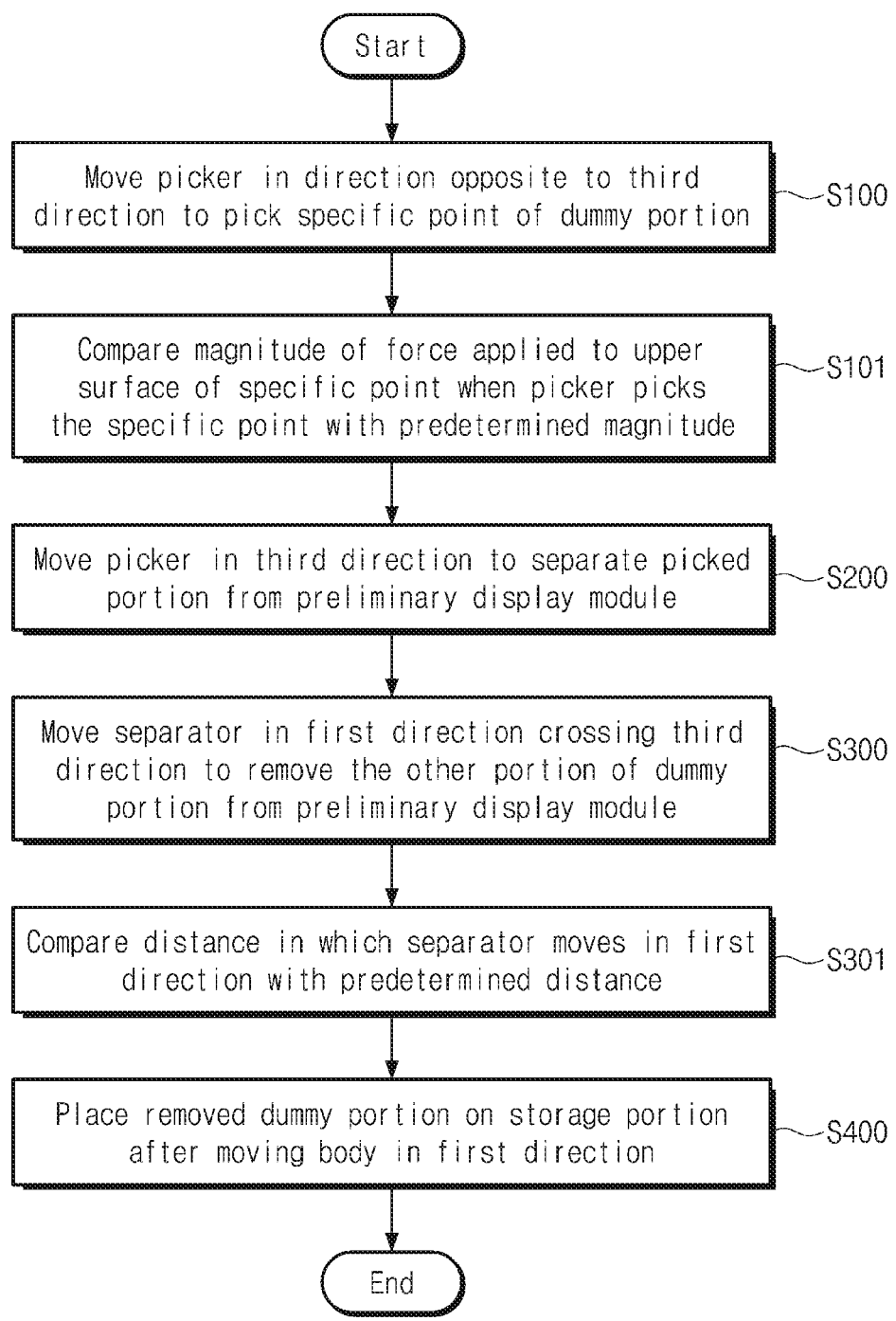
FIG. 14 is a flowchart showing a method of driving a dummy removal device according to an embodiment.

FIG. 14 is a flowchart showing a method of driving the dummy removal device according to an embodiment.

Referring to FIGS. 8A, 8B, and 14, the picker PK included in the dummy removal device PRD may move in the opposite direction to the third direction DR3 to pick the specific point AR (refer to FIG. 7) of the dummy portion PP (S100). The error detector ED included in the dummy removal device PRD may compare the magnitude of the force by the picker PK, which is applied to pick the specific point, with the predetermined magnitude to determine whether the picker PK is normally operated (S101). Referring to FIGS. 9A, 9B, and 14, in case that the error detector ED determines that the picker PK is normally operated and does not transmit the error occurrence signal to the dummy removal device PRD, the first portion PP_a picked by the picker PK may be separated from the preliminary display module PDM in case that the picker PK moves in the third direction DR3 (S200). Although not shown in figures, the error detector ED may determine whether the first portion PP_a picked by the picker PK is sufficiently separated from the preliminary display module PDM.

Referring to FIGS. 10A to 10C and 14, the dummy removal device PRD may move the separator SPT in the first direction DR1 to remove the second portion PP_b of the dummy portion PP from the preliminary display module PDM (S300).

The error detector ED may compare the travel distance in which the lift portion LP included in the separator SPT moves in the first direction DR1 with the predetermined distance to determine whether the separator SPT is normally operated (S301).

In the case where the error detector ED determines that the picker PK and the separator SPT are normally operated, the body BD included in the dummy removal device PRD may move in the first direction DR1. The picker PK may place the dummy portion PP picked thereby on the storage portion SR (S400). The body BD may move in the opposite direction to the first direction DR1, and the dummy removal device PRD may perform a process of removing a dummy portion from a new preliminary display module.

In the case where the error detector ED determines that at least one of the picker PK and the separator SPT is abnormally operated, the dummy removal device PRD may stop its operation. However, according to an embodiment, at least one of the operation of determining whether the picker PK is normally operated using the error detector ED (S101) or the operation of determining whether the separator SPT is normally operated using the error detector ED (S301) may be omitted in the performing of the operation of the dummy removal device PRD.

Although the embodiments have been described, it is understood that the disclosure should not be limited to these embodiments but various changes and modifications can be made by one of ordinary skill in the art within the spirit and scope of the disclosure as hereinafter claimed.

Therefore, the disclosed subject matter should not be limited to any single embodiment described herein, and the scope of the disclosure shall be determined according to the attached claims.

What is claimed is:

1. A dummy removal device comprising:
   a picker picking a point of a dummy portion of a preliminary display module and moving in a first moving direction to separate a first portion of the dummy portion from the preliminary display module; and
   a separator moving in a second moving direction intersecting the first moving direction to remove a second portion of the dummy portion from the preliminary display module, wherein
   the separator comprises a lift portion disposed under separated first Portion, and moving in the second moving direction, and
   the dummy portion is disposed around a display device substrate portion of the preliminary display module.

2. The dummy removal device of claim 1, wherein the point is disposed at a side of the preliminary display module.

3. The dummy removal device of claim 2, wherein the point comprises:
   a first point; and
   a second point spaced apart from the first point in a third moving direction intersecting the first moving direction and the second moving direction.

4. The dummy removal device of claim 3, further comprising a body, wherein the picker comprises:
   a first moving tool connected to the body and moving in the first moving direction;
   a first picker adsorption portion connected to the first moving tool and picking the first point; and
   a second picker adsorption portion connected to the first moving tool and picking the second point.

5. The dummy removal device of claim 4, wherein
   the first moving direction is substantially perpendicular to the second moving direction, and
   the third moving direction is substantially perpendicular to the first moving direction and second moving direction.

6. The dummy removal device of claim 1, further comprising a body, wherein the separator comprises:
   a moving tool connected to the body and moving in the second moving direction; and
   the lift portion connected to the moving tool.

7. The dummy removal device of claim 6, wherein
   the picker picks an upper surface of the first portion to separate the first portion from the preliminary display module, and
   the lift portion removes the second portion from the preliminary display module.

8. The dummy removal device of claim 7, wherein the lift portion has a shape substantially extending in a third moving direction intersecting the first moving direction and the second moving direction.

9. The dummy removal device of claim 8, wherein the lift portion has a substantially cylindrical shape.

10. The dummy removal device of claim 8, wherein the lift portion comprises block portions disposed at opposite ends of the lift portion, extending in the first moving direction, wherein the block portions guide a position of the dummy portion.

11. The dummy removal device of claim 6, wherein
    the picker picks the upper surface of the first portion to separate the first portion from the preliminary display module, and
    the lift portion comprises a straight portion extending in first direction intersecting the first moving direction and the second moving direction, and a grip portion disposed to cover a side surface and the upper surface of the separated first portion.

12. The dummy removal device of claim 1, further comprising an error detector that transmits an error occurrence signal to the dummy removal device when the picker and the separator are abnormally operated.

13. The dummy removal device of claim 12, wherein the error detector stops an operation of the dummy removal device in case that a magnitude of a force by the picker that is applied to the point that picks the point is less than a predetermined magnitude.

14. The dummy removal device of claim 12, wherein the error detector stops the operation of the dummy removal device in case that a travel distance in which the separator moves in the second moving direction is less than a predetermined distance.

15. The dummy removal device of claim 1, wherein
    a portion of the separator is disposed between the separated first portion and the display device substrate portion.

16. A method of driving a dummy removal device comprising:
    picking a point of a dummy portion of a preliminary display module using a picker;
    moving the picker in a first moving direction to separate a first portion of the dummy portion from the preliminary display module; and
    moving a separator disposed adjacent to the separated first portion in a second moving direction intersecting the first moving direction to remove a second portion of the dummy portion from the preliminary display module, wherein
    the separator comprises a lift portion disposed under the separated first portion, and moving in the second moving direction, and
    the dummy portion is disposed around a display device substrate portion of the preliminary display module.

17. The method of claim 16, further comprising:
    placing the removed dummy portion on a storage portion, wherein
    the dummy removal device comprises a body connected to the picker and the separator, and
    the picker places the removed dummy portion after the body moves in the second moving direction.

18. The method of claim 16, further comprising determining whether the picker and the separator do not transmit an error occurrence signal to the dummy removal device.

19. The method of claim 18, wherein the determining of whether the picker and the separator do not transmit the error occurrence signal to the dummy removal device comprises comparing a magnitude of a force applied to the point to pick the point by the picker with a predetermined magnitude.

20. The method of claim 18, wherein the determining of whether the picker and the separator do not transmit the error occurrence signal to the dummy removal device comprises comparing a travel distance in which the separator moves in the second moving direction with a predetermined distance.

21. The method of claim 16, wherein the separating of the first portion of the dummy portion from the preliminary display module comprises:

moving the picker in a direction opposite to the first moving direction to pick the point; and moving the picker in the first moving direction to separate the separated first portion from the preliminary display module, and the point is disposed at a side of the preliminary display module.

* * * * *